United States Patent [19]

Kim

[11] Patent Number: 5,147,081
[45] Date of Patent: Sep. 15, 1992

[54] FLAT PACK DESOLDERING TOOL

[76] Inventor: Henry Kim, 12665 Salmon River Rd., San Diego, Calif. 92129

[21] Appl. No.: 757,020

[22] Filed: Sep. 9, 1991

Related U.S. Application Data

[63] Continuation-in-part of Ser. No. 557,451, Jul. 25, 1990, Pat. No. 5,054,681.

[51] Int. Cl.⁵ .................................................. B23K 3/03
[52] U.S. Cl. ......................................... 228/51; 228/53; 219/229
[58] Field of Search ............... 228/51, 53, 55, 119, 228/180.2, 264; 29/750, 758, 764; 219/227, 229, 240

[56] References Cited

U.S. PATENT DOCUMENTS

| | | | |
|---|---|---|---|
| 4,034,202 | 7/1977 | Vandermark | 228/51 |
| 4,518,110 | 5/1985 | Breske et al. | 228/51 |
| 4,528,746 | 7/1985 | Yoshimura | 228/55 |
| 4,896,019 | 1/1990 | Hyun | 228/51 |
| 4,962,878 | 10/1990 | Kent | 228/55 |

*Primary Examiner*—Samuel M. Heinrich
*Attorney, Agent, or Firm*—Ralph S. Branscomb

[57] ABSTRACT

A specialized desoldering iron utilizes a blade which takes the form of a quadrilateral enclosure having a pair of heating elements mounted to two opposite walls of the enclosure. The enclosure is shaped and dimensioned to fit over a quad flat pack integrated circuit such that the lower edges of the walls of the enclosure come down onto the soldered leads of the integrated circuit. The two heating elements provide enough heat to simultaneously desolder all of the leads of a large quad flat pack, and the enclosure is open-topped so that the large heat sinks which are mounted atop IC's that consume a high level of power do not interfere with the desoldering process.

6 Claims, 1 Drawing Sheet

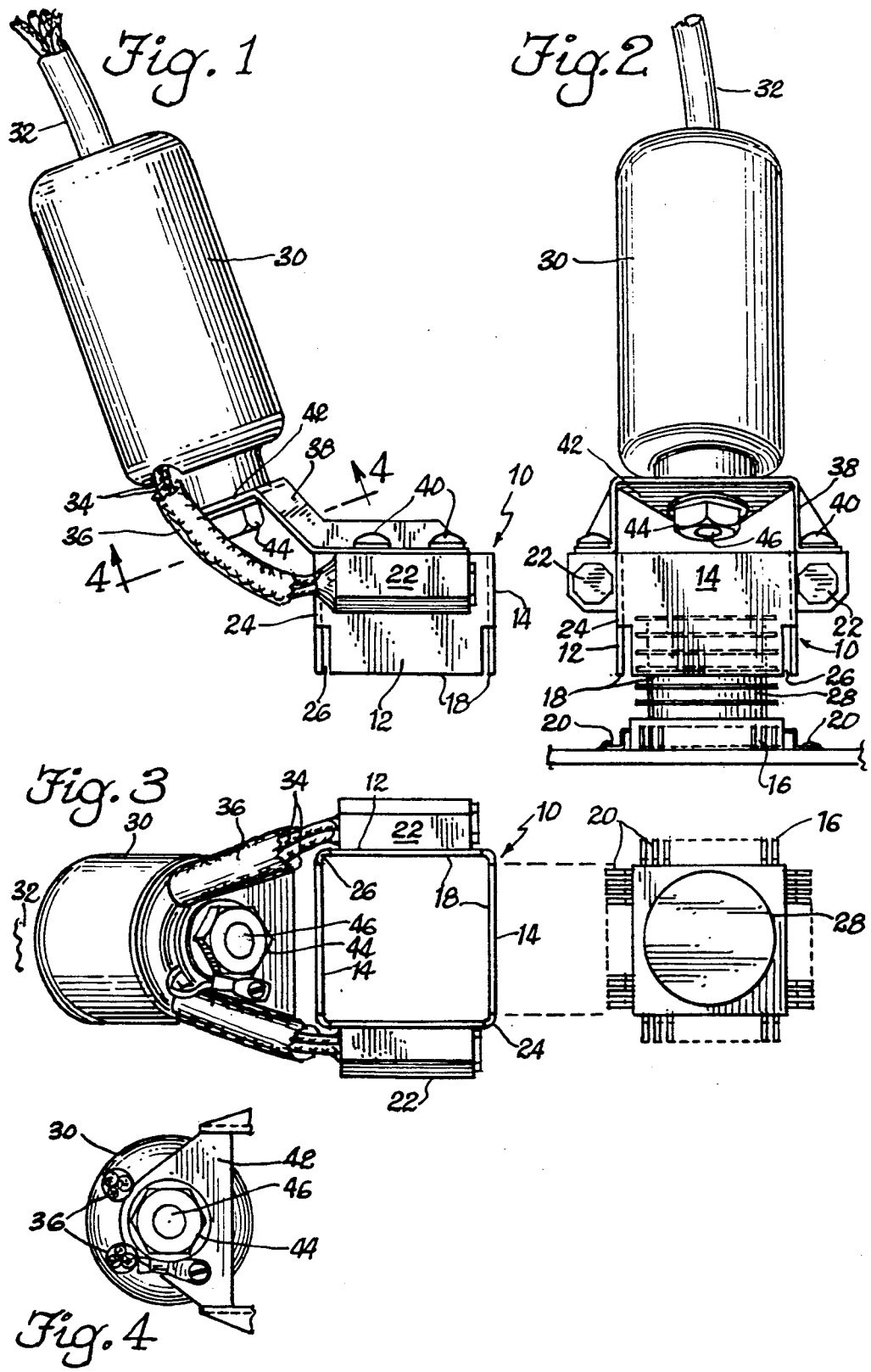

FLAT PACK DESOLDERING TOOL

BACKGROUND OF THE INVENTION

This invention is one of several inventions relating to the de-soldering of circuit board components, and is a continuation-in-part of application Ser. No. 07/557,451, filed Jul. 25, 1990, now U.S. Pat. No. 5,054,681, by Henry I. Kim, the inventor in the instant application, for a COMPONENT DESOLDERING TOOL.

The invention disclosed in that case was a special copper hood that could be pressed over a quad IC and then heated with a hot air gun or some other heating means to melt the four rows of soldered leads simultaneously.

A limitation of the device of the parent case lies in the fact that it has a continuous top which connects the four sides. The top is necessary to transfer heat from the hot air gun or other heating element to the sides. In the case of the hot air gun, it also prevents the hot air from directly contacting the IC, and the concave top deflects heat away from adjacent IC's. However, if the IC is of the large type requiring a large desoldering element in the first place, and the large IC has a large heat sink mounted on the top, the hood will not work as it conflicts with the heat sink. Even if the hood had long depending side skirts to accommodate a heat sink, the heat that could be applied to the unit from a single heat source would be inadequate in many cases to simultaneous melt the solder on all the leads on all four sides of the IC.

There is a need, therefore, for a device that carries forth the spirit of the invention of the parent case, but accommodates the needs of IC's that are very large dimensionally and mount large heat sinks on top.

SUMMARY OF THE INVENTION

The instant invention fulfills the above stated need and comprises an enclosure which is made of four continuous walls which fit down over an IC to simultaneously melt the solder on the leads on all four sides. The walls form a corral-like enclosure with a completely open top, such that a heat sink on top of an IC can extend vertically as far as necessary, provided the diameter of the heat sink does not exceed that of the four-walled enclosure.

Because there is no top to conduct heat over a short distance to the four sides, two heating elements (instead of one) are horizontally extended on opposite sides of the enclosure adjacent the upper portions of the walls and extending parallel to the length of the walls.

BRIEF DESCRIPTION OF THE DRAWINGS

FIG. 1 is a side elevation view of the desoldering tool;

FIG. 2 is a front elevational view of the desoldering tool illustrating it in use on a flat pack quad IC;

FIG. 3 is a bottom elevation view of the desoldering tool illustrating the dimensional relationship between the enclosure and the quad flat pack IC; and, FIG. 4 is a section taken along line 4—4 of FIG. 1.

DETAILED DESCRIPTION OF THE PREFERRED EMBODIMENT

At the heart of the invention is the enclosure 10 which is comprised of two opposite heating walls 12 and two opposite heated walls 14. The term "enclosure" is used to include both the walls and the void enclosed within the walls in this application. The walls and the enclosure are formed from a continuous strip of copper which is bent at three places to define orthogonal joints, with the ends meeting at a fourth orthogonal joint.

The copper walls are dimensioned to fit neatly over the large, quadrilateral flat pack integrated circuit 16. The term "quad" as used herein refers to the four-sided nature of the IC, rather than the quadruple occurrence of any circuitry within the IC. As can be seen in FIGS. 2 and 3, the enclosure fits down over the IC such that the bottom edges 18 of the enclosure hit directly on the row of soldered leads 20. The IC shown in the drawings is one type of surface mount IC, but the unit will work equally well on the other type which has leads that are curled under rather than extending out as shown in the Figures.

The bottom edges 18 of the enclosure define a plane, inasmuch as the soldering leads 20 define a plane, so that substantial universal contact between the enclosure and all soldered leads is made when the enclosure is pressed down over the IC as indicated in dotted line in FIG. 2. The IC's typical of those desoldered with the instant tool have a planform dimension on the order of $\frac{3}{4}'' \times 1\frac{1}{4}''$.

These large IC's have such considerable spacing between various solder points that it might be difficult for a single, conventional soldering element to heat all of the leads simultaneously. Thus in order to ensure quick, adequate heat delivery to simultaneously desolder all of the solder points 20, two heating elements 22 are brazed or otherwise fastened to the two heating walls 12 of the enclosure, spanning substantially the entire lengths of the two walls to maximize their heat delivery capabilities.

It should be noted that the walls extend up above the height of the IC to a considerable height, which would be at least $\frac{1}{2}''$ inasmuch the heating elements 22 are about $\frac{1}{2}$ inch wide. It is highly desirable to put the heating elements above the plane defined by the top of the IC so that they will not interfere with adjacent components. The illustrated unit, which is exactly like the units in use, actually spaces the heating elements even higher than this to clear other components which extend up farther than do the IC's, such as capacitors, resistor packs, etc.

Because heat will destroy an IC, it is important to avoid long exposure to heat on the part of the integrated circuit chip. This is accomplished by means of the double heating elements 22, which have adequate power to quickly and efficiently melt the solder before excessive heat has been conducted to the interior of the IC. Also, at the orthogonal edges 24, slots 26 are provided in the bottoms, which align with the corners of the IC, as shown in FIG. 3, where there are no leads. These slots have the dual function of minimizing the heat applied to the IC by avoiding applying heat where there are no leads, and also providing small vents so that there is some circulation of air over the IC.

One of the motivations behind the instant design was to create a desoldering tool which could accommodate IC's having large, upwardly extending tower-like heat sinks such as that indicated at 28 in the drawings. To accommodate these heat sinks, the enclosure 10 is open-topped as indicated in FIG. 3. Although even a tall heat sink would not extend much beyond the top of the enclosure 10, nonetheless the positioning and angling of the handle 30 permits the user to hold the handle at a convenient angle, with both his hand and the handle clearing the space above the open-topped enclosure 10.

The handle is a single, hollow ceramic unit. A power supply line in the form of a cord 32 enters the top end of the handle at a central opening therein, and within the handle, not shown, connects to two separate supply wires 34 which supply the two heating elements with the same voltage. The other end of the cord 32, not shown, has a special connector which is engaged in a variable-voltage power supply produced by the company owned by the inventor and made specifically for powering soldering irons and other, specialized soldering and desoldering tools. The supply wires 34 are covered with heat resistant insulating sleeves 36.

The handle 30 is mounted to the enclosure by means of a stainless steel yoke 38 which is screwed into threaded bores in the heating elements at 40. The cross member 42 of the yoke is bolted to the handle by means of a nut 44 which is threaded onto axial shaft 46 which extends from the ceramic handle.

This unit is fast-acting, safe, easy to use and relatively inexpensive to manufacture. It is one more in a line of specialty tools provided by the inventor for the circuit board manufacturing business, both to quickly solder components to the board and to desolder defective components so that they can be replaced by a good component, with the result that the board can be saved rather than being discarded by quality control during testing.

I hereby claim:

1. A desoldering tool for simultaneously desoldering the four rows of contacts from the four sides of a quad flat pack IC comprising:
   (a) an enclosure having four substantially contiguous walls;
   (b) the lower edges of said four walls being spaced, oriented and dimensioned to simultaneously rest against the four rows of contacts of a quad IC when said enclosure is placed over same;
   (c) heating means for heating said walls;
   (d) said enclosure being substantially completely open at the top; and,
   (e) a handle mounted to said enclosure.

2. A desoldering tool for simultaneously desoldering the four rows of contacts from the four sides of a quad flat pack IC comprising:
   (a) an enclosure having four substantially contiguous walls;
   (b) the lower edges of said four walls being spaced, oriented and dimensioned to simultaneously rest against the four rows of contacts of a quad IC when said enclosure is placed over same;
   (c) at least two heating elements, said heating elements being mounted on opposite walls of said enclosure, which walls are heating walls;
   (d) power supply means for supplying power to said heating elements;
   (e) a handle mounted to said enclosure; and,
   (f) said enclosure being substantially completely open at the top to permit same to be lowered onto a quad IC having a vertically extended heat sink mounted to the top thereof.

3. Structure according to claim 2 wherein said handle extends from said enclosure at an oblique angle to permit said handle to be hand-held without obstructing the space above said enclosure with either the hand or the handle.

4. Structure according to claim 2 wherein said walls are at least ½ inch higher than the height of an IC mounted on a board and said heating elements are mounted substantially in the top half-inch of the heating walls.

5. A desoldering tool for simultaneously desoldering the four rows of contacts from the four sides of a quad flat pack IC comprising:
   (a) an enclosure having four substantially contiguous walls;
   (b) the lower edges of said four walls being spaced, oriented and dimensioned to simultaneously rest against the four rows of contacts of a quad IC when said enclosure is placed over same;
   (c) at least two heating elements, said heating elements being mounted on opposite walls of said enclosure, which walls are heating walls;
   (d) power supply means for supplying power to said heating elements;
   (e) a handle mounted to said enclosure,
   (f) said heating elements being elongated and extending horizontally along said heating walls to run in the direction of the length of said heating walls and substantially span the entire lengths of said heating walls;
   (g) said heating elements being mounted to said heating walls and including a yoke mounted to said heating elements, with said handle being mounted to said yoke and thus mounted to said enclosure through said yoke and heating element.

6. A desoldering tool for simultaneously desoldering the four rows of contacts from the four sides of a quad flat pack IC comprising:
   (a) an enclosure having four substantially contiguous walls;
   (b) the lower edges of said four walls being spaced, oriented and dimensioned to simultaneously rest against the four rows of contacts of a quad IC when said enclosure is placed over same;
   (c) at least two heating elements, said heating elements being mounted on opposite walls of said enclosure, which walls are heating walls;
   (d) power supply means for supplying power to said heating elements;
   (e) a handle mounted to said enclosure,
   (f) said heating elements being elongated and extending horizontally along said heating walls to run in the direction of the length of said heating walls; and,
   (g) said heating elements being brazed to said heating walls to maximize heat conductivity therebetween.

* * * * *